United States Patent [19]

Nakaya et al.

[11] Patent Number: 5,096,735
[45] Date of Patent: Mar. 17, 1992

[54] PROCESS FOR PRODUCING A THIN FILM ELECTROLUMINESCENT DEVICE

[75] Inventors: Hiroaki Nakaya; Takuo Yamashita, both of Tenri; Takashi Ogura, Nara; Kouji Taniguchi, Nara; Koichi Tanaka, Nara; Akiyoshi Mikami, Yamatotakada; Katsushi Okibayashi, Sakurai; Kousuke Terada, Tenri, all of Japan

[73] Assignee: Sharp Kabushiki Kaisha, Osaka, Japan

[21] Appl. No.: 656,427

[22] Filed: Feb. 5, 1991

[30] Foreign Application Priority Data

Feb. 7, 1990 [JP] Japan .................................... 2-27863
Feb. 7, 1990 [JP] Japan .................................... 2-28683

[51] Int. Cl.⁵ ................................................ B05D 3/06
[52] U.S. Cl. ..................................... 427/38; 156/663; 204/192.22; 204/192.23; 427/66; 427/255; 427/255.2; 427/255.7; 427/331; 427/419.3; 427/419.7
[58] Field of Search ................ 427/38, 66, 255, 255.2, 427/255.7, 331, 419.3, 419.7; 204/192.22, 192.23; 156/663

Primary Examiner—Bernard Pianalto
Attorney, Agent, or Firm—Birch, Stewart, Kolasch & Birch

[57] ABSTRACT

Disclosed is an improvement of a process for producing a thin film electroluminescent device wherein the luminescent film is formed by a CVD method. The improvement residues in that an unnecessary portion of the luminescent layer, which is inherently formed if the CVD method is employed, is removed by etching.

4 Claims, 5 Drawing Sheets

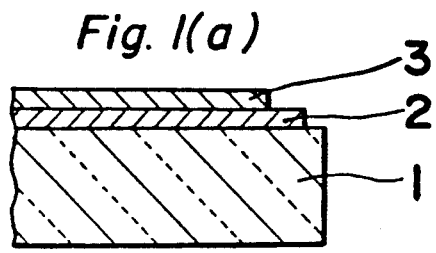
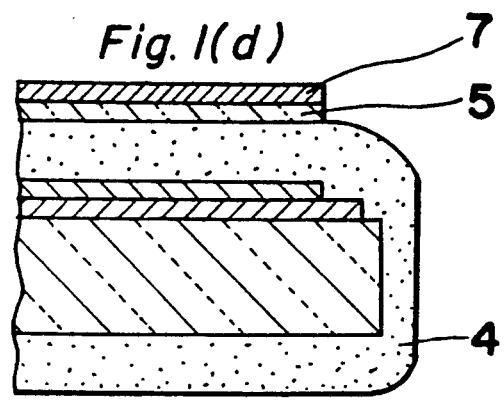
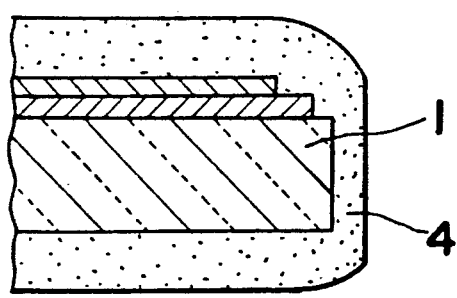
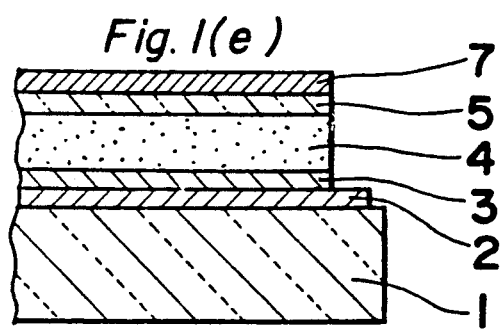
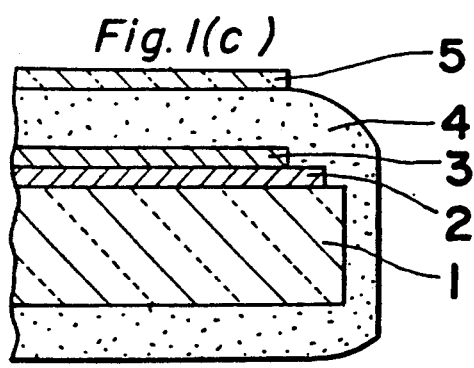
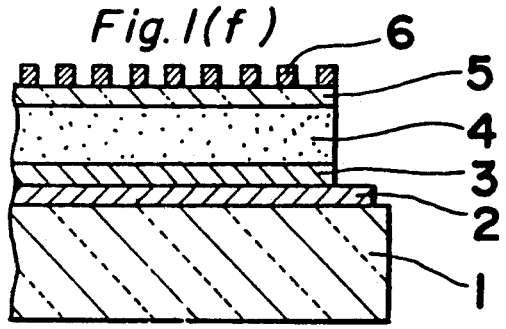

PROCESS FOR PRODUCING A THIN FILM ELECTROLUMINESCENT DEVICE

FIELD OF THE INVENTION

The present invention relates to a process for producing a thin film electroluminescent device.

BACKGROUND OF THE INVENTION

A thin film electroluminescent device generally has a cross sectional view as shown in FIG. 4. A transparent electrode 2 is formed on a glass substrate in the form of stripes, and a lower insulation layer 3, which is composed of an $SiO_2$ layer $3a$ and an $Si_3N_4$ layer $3b$, is formed thereon. A luminescent layer 4 is then formed on the insulation layer 3 by an electron beam vapor deposition method, and a transparent upper insulation layer 5, which is composed of an $Si_3N_4$ layer $5a$ and an $Al_2O_3$ layer $5b$, is formed thereon by a sputtering method. An aluminum back electrode 6 is formed on the upper insulation layer 5 by a chemical etching method in the form of stripes which are perpendicular to the lower transparent electrode 2. A voltage is applied between the transparent electrode 2 and the back electrode 6 to emit light in the luminescent layer 4 and the light comes out through the glass substrate 1.

However, since the luminescent layer 4 is formed by the electron beam vapor deposition, the initially formed portion has poor crystallinity, called "dead layer". Accordingly, in order to obtain high luminance, the luminescent layer 4 should be made thick, which adversely increase the driving voltage. The present inventors propose in Japanese Patent Application Ser. No. 117943/1988 that the problem is dissolved by producing the luminescent layer 4 by a chemical vapor deposition (CVD) method.

The CVD method, however, forms the luminescent layer as surrounding the substrate, thus the layer covering all the surface of the substrate, as indicated the layer 4 of FIG. 1. The unnecessary portion of the luminescent layer 4 should be removed, so that an etching step is inevitable and causes the cost-up of the obtained products.

SUMMARY OF THE INVENTION

The present invention provides an improvement of a process for producing a thin film electroluminescent device wherein the luminescent film is formed by a CVD method. The improvement residues in that an unnecessary portion of the luminescent layer, which is inherently formed if the CVD method is employed, is removed by etching.

Thus, the present invention provides a process for preparing a thin film electroluminescent device comprising forming on a substrate a transparent electrode, a lower insulation layer, a luminescent layer, an upper insulation layer and a back electrode in the order starting with said transparent electrode, wherein said luminescent layer is formed by a chemical vapor deposition (CVD) method; an improvement being present in that said insulation layer is formed on said deposited luminescent layer, a photoresist is formed thereon so as to cover a necessary portion of said deposited luminescent layer and then the unnecessary portion of said luminescent layer, which is inherently formed when said CVD method is employed, is removed by etching.

The present invention also provides a process for preparing a thin film electroluminescent device comprising forming on a substrate a transparent electrode, a lower insulation layer, a luminescent layer, an upper insulation layer and a back electrode in the order starting with said transparent electrode, wherein said luminescent layer is formed by a chemical vapor deposition (CVD) method; an improvement being present in that an unnecessary portion of said luminescent layer, which is inherently formed when said CVD method is employed, is removed by etching, but the etching simultaneously patterns said back electrode.

BRIEF EXPLANATION OF THE DRAWINGS

FIG. 1 is a process drawing which shows an embodiment of the process of the present invention.

PREFERRED EMBODIMENTS OF THE INVENTION

Embodiment 1

Figure 2A:
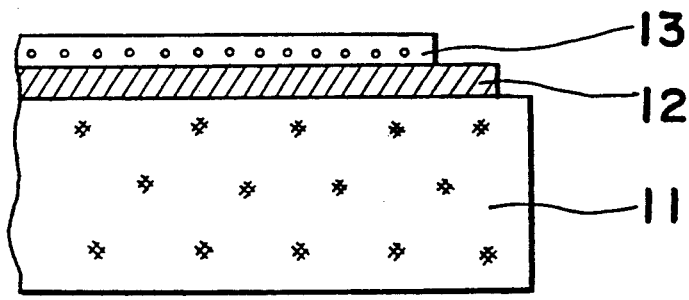
FIG. 2 is a process drawing which shows another embodiment of the process of the present invention.
Figure 2B:
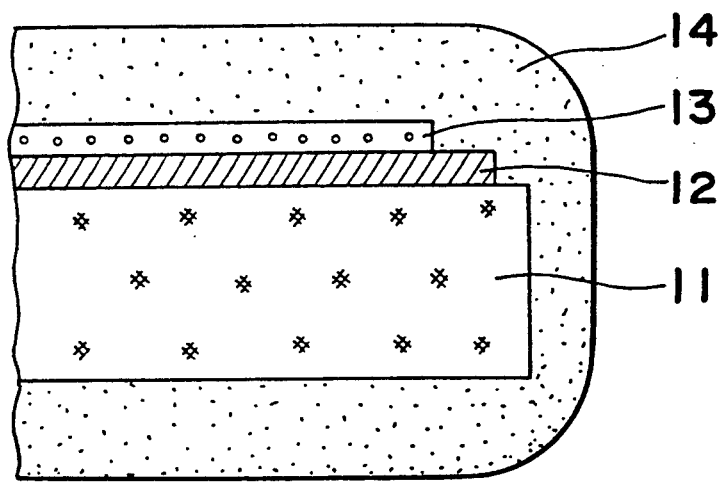
Figure 2C:
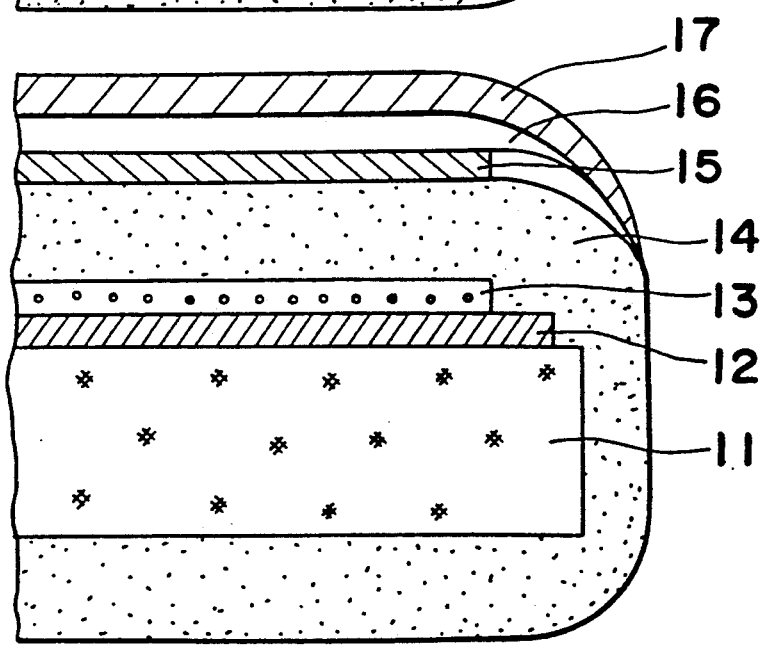
Figure 2D:
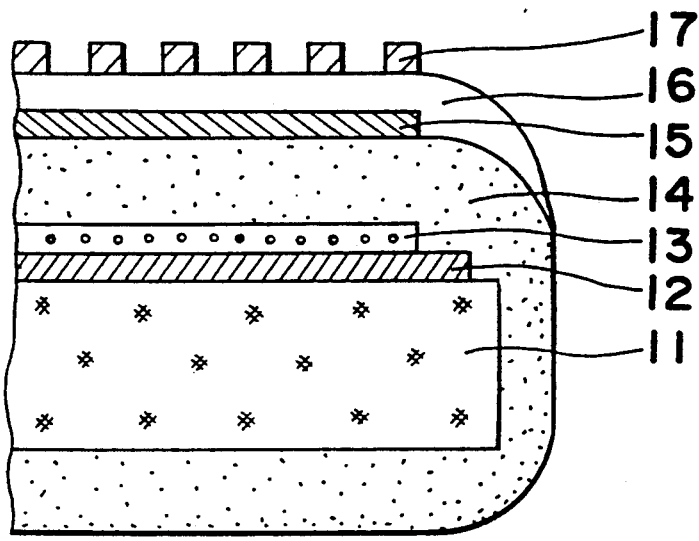
Figure 2E:
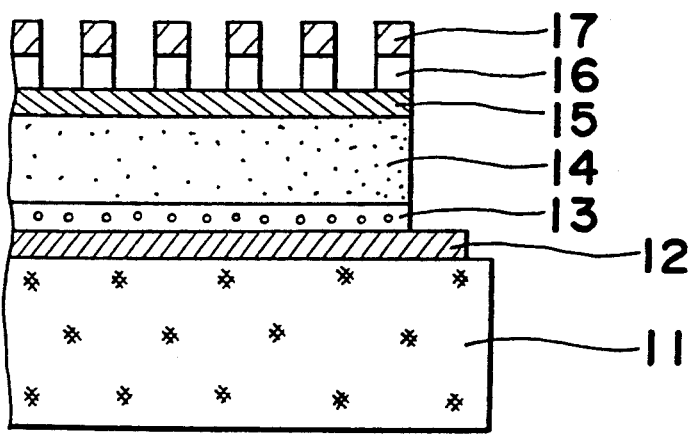
Figure 2F:
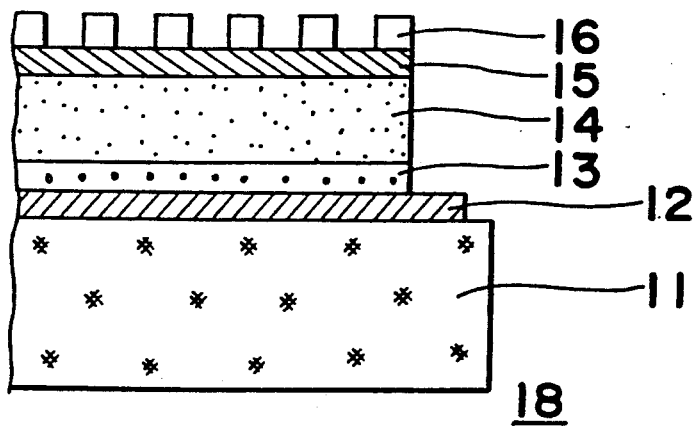

FIG. 1 is a process drawing which shows an embodiment of the process of the present invention.

As is shown in FIG. 1 (a), a transparent electrode 2 was formed on a glass substrate and then a lower insulation layer 3 was formed thereon, by a conventional method. A luminescent layer 4 was then formed by a CVD method, while the surface of the substrate 1, precisely the surface of the substrate 1 and the formed layers 2 and 3, was surrounded with the luminescent layer 4, based on the characteristics of the CVD method, as shown in FIG. 1 (b). An upper insulation layer 5 which was composed of an $Si_3N_4$ layer and an $Al_2O_3$ layer was formed by spattering as facing with the lower insulation layer 3 (see FIG. 1 (c)).

Next, a positive photoresist was coated by a spinner as covering the upper insulation layer 5 and then heated at 70° C. for 2 to 3 minutes to cure the resist. The cured resist was exposed to light through a positive mask and developed a developer (e.g. acetone) to form a photoresist pattern 7 on the upper insulation layer 5 so as to expose the unnecessary portion of the luminescent layer 4, as shown in FIG. 1 (d). It was then etched with an etchant (e.g. hydrochloric acid) to remove the unnecessary portion of the luminescent layer 4, which is shown in FIG. 1 (e). After the remained photoresist pattern 7 was removed, a back electrode 6 of aluminum was formed to obtain a desired thin film electroluminescent device.

Embodiment 2

FIG. 2 is a process drawing which shows another embodiment of the process of the present invention.

Figure 3:
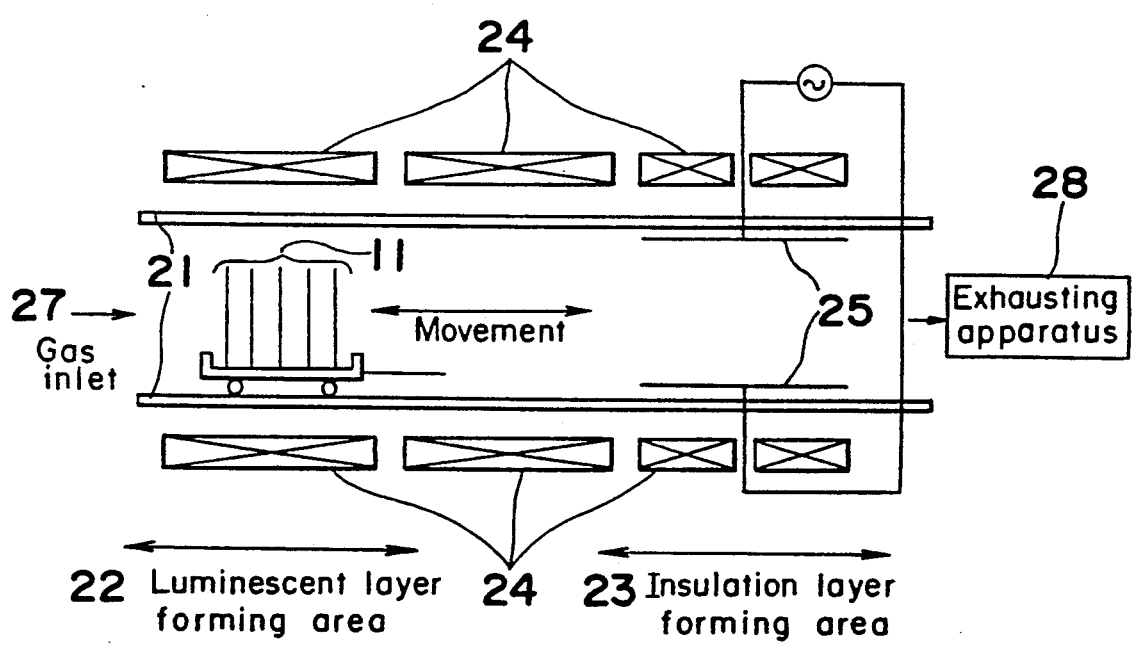
FIG. 3 schematically shows a CVD apparatus for producing the electroluminescent device of the present invention.
Figure 4:
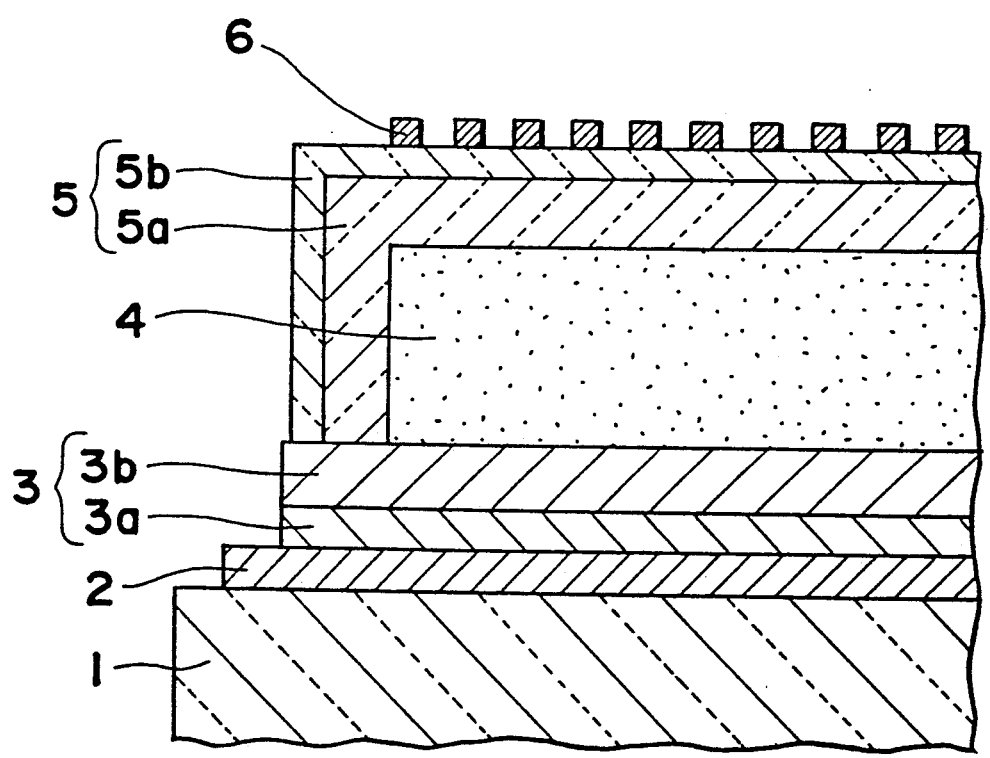
FIG. 4 shows a cross sectional view of the thin film electroluminescent device of the present invention.

FIG. 3 schematically shows a CVD apparatus for producing the electroluminescent device of the present invention.

As is shown in FIG. 3, a quartz tube 21 has a luminescent layer forming area 22 by a CVD method and an insulating layer forming area 23 by a plasma CVD method, and is surrounded with heaters 24.

Glass substrates 11 having thereon a stripe type transparent electrode layer 12 were put on a substrate holder 26 (FIG. 3) which is placed in the insulating layer forming area 23. The reaction tube 21 kept at a pressure of 0.1 to 10 torr by an exhaust system, into which SiH$_4$ gas (0.1 to 5 sccm) and N$_2$ gas (20 to 200 sccm) was introduced from a gas inlet 27. In this condition, a radiofrequency electric power of 100 to 400 W was applied to a radiofrequency electrode 25 to generate discharge, thus producing an Si$_3$N$_4$ film 13 on the substrates 26. Of course, if N$_2$O gas was mixed with N$_2$ gas, an SiON or SiO$_2$ film could be formed. If gas was changed with another gas, a laminated film could also be formed. The insulation layer 13 may be also formed by a CVD method.

Subsequently, the substrates 26 were moved to the luminescent layer forming area 22, and heated to 350° to 650° C. At this temperature range, H$_2$ gas flew at a flow rate of 50 to 500 sccm and solid ZnS is transferred therewith, and HCl gas flew at a flow rate of 0.5 to 50 sccm and solid Mn was transferred therewith to form a ZnS:Mn luminescent film on the substrate 26. In this process, the substrate was surrounded with the luminescent layer 4, not only on the surface of the insulating layer 13 but also the side or opposite surface of the substrate 26, as shown in FIG. 2 (b).

Next, the substrates 26 were again moved to the insulating layer forming area 23 and an upper insulation layer 15 was formed as generally described above.

In this example, aluminum was vapor-deposited onto throughout the surface of the upper insulation layer 15 to form an aluminum layer 16 which was then coated with a photoresist layer 17. The photoresist was exposed and developed to form a pattern by which the aluminum layer 16 was etched to stripe electrodes 17 perpendicular to the transparent electrode 12 and the unnecessary portion of the luminescent layer 14 was simultaneously etched (see FIG. 2(d) and (e)).

In this process, the ZnS:Mn luminescent layer 14 and the aluminum layer 16 are simultaneously etched so as to simplify the producing process. The etchant can be easily chosen by the people pertained in this field, but, for example, hydrochloric acid or a combination of hydrochloric acid and phosphoric acid is preferred for eliminating the ZnS:Mn layer 14 and aluminum layer 16. The etching in this embodiment was carried out at 50° C. for about one minute, wherein the insulation layer was not etched. The resist 17 was removed by a remover to obtain a device 18 of the present invention (see FIG. 2 (f)).

The above two embodiments are explained by the ZnS:Mn luminescent layer and the Si$_3$N$_4$ and SiO$_2$, but it is not limited and other luminescent layers and other insulation layers can be employed. It should be noted that the present invention is not limited to the above explained details.

According to the present invention, the unnecessary portion of the luminescent layer is etched together with either the upper insulation layer or the back electrode, so that the process is very simplified and the production cost is reduced. The luminescent layer is prepared by the CVD method. The CVD method effectively produces the luminescent layer having high quality in comparison with the conventional electron beam method.

What is claimed is:

1. A process for preparing a thin film electroluminescent device comprising forming on a substrate a transparent electrode, a lower insulation layer, a luminescent layer, an upper insulation layer and a back electrode in the order starting with said transparent electrode, wherein said luminescent layer is formed by a chemical vapor deposition (CVD) method; an improvement being present in that said insulation layer is formed on said deposited luminescent layer, a photoresist is formed thereon so as to cover a necessary portion of said deposited luminescent layer and then the unnecessary portion of said luminescent layer, which is inherently formed when said CVD method is employed, is removed by etching.

2. The process according to claim 1 wherein said lower and upper insulation layer is composed of an Si$_3$N$_4$ layer and an Al$_2$O$_3$ layer and formed by spattering, PCVD or CVD.

3. A process for preparing a thin film electroluminescent device comprising forming on a substrate a transparent electrode, a lower insulation layer, a luminescent layer, an upper insulation layer and a back electrode in the order starting with said transparent electrode, wherein said luminescent layer is formed by a chemical vapor deposition (CVD) method; an improvement being present in that an unnecessary portion of said luminescent layer, which is inherently formed when said CVD method is employed, is removed by etching, but the etching simultaneously patterns said back electrode.

4. The process according to claim 3 wherein said back electrode is etched with hydrochloric acid of a combination of hydrochloric acid and phosphoric acid together with said luminescent layer.

* * * * *